United States Patent [19]
Fukuda et al.

[11] Patent Number: 5,607,733
[45] Date of Patent: Mar. 4, 1997

[54] PROCESS FOR PREPARING AN X-RAY MASK STRUCTURE

[75] Inventors: Yasuaki Fukuda, Hadano; Shigeyuki Matsumoto, Atsugi, both of Japan

[73] Assignee: Canon Kabushiki Kaisha, Tokyo, Japan

[21] Appl. No.: 475,464

[22] Filed: Jun. 7, 1995

Related U.S. Application Data

[62] Division of Ser. No. 329,787, Oct. 27, 1994, which is a continuation of Ser. No. 122,649, Sep. 17, 1993, abandoned, which is a continuation of Ser. No. 727,961, Jul. 10, 1991, abandoned.

[30] Foreign Application Priority Data

Jul. 12, 1990 [JP] Japan .................. 2-186795
Jul. 27, 1990 [JP] Japan .................. 2-199746

[51] Int. Cl.⁶ ............................................. C23C 8/00
[52] U.S. Cl. ............... 427/585; 427/65; 427/248.1; 427/258; 427/259; 427/264; 427/265; 427/270; 427/272; 427/282; 427/402; 427/419.7
[58] Field of Search .............. 427/65, 585, 248.1, 427/258, 402, 259, 264, 265, 270, 272, 282, 419.7

[56] References Cited

U.S. PATENT DOCUMENTS

| 4,515,876 | 5/1985 | Yoshihara et al. | 378/35 |
| 4,728,591 | 3/1988 | Clark et al. | 430/5 |

FOREIGN PATENT DOCUMENTS

| 0058214 | 8/1982 | European Pat. Off. |
| 0234567 | 9/1987 | European Pat. Off. |
| 3325832 | 1/1984 | Germany |
| 0044143 | 12/1988 | WIPO |

OTHER PUBLICATIONS

Patent Abstracts of Japan, vol. 11, No. 382 (E–564) Dec. 12, 1987 & JP-A-62 147 730 (Mitsubishi Electric Corp. ) Jul. 1, 1987.

Patent Abstracts of Japan, vol. 15, No. 213 (E–1073) May 30, 1991 & JP-A-30 60 112 (Nippon Telegraph & Telephone Corp.) Mar. 15, 1991.

M. Itoh et al., "The origin of stress in sputter–deposited tungsten films for x–ray masks", Journal of Vacuum Science and Technology B; vol. 9, No. 1, Jan./Feb. 1991, pp. 149–153, New York, US.

R.F. Bunshah et al., Deposition Technologies for Films and Coatings, Noyes Publication, New Jersey, pp. 289, 296, 297, 300 and 301. (No Date Avail).

S. Wolf and R. Taubes, Silicon Processing for the VLSI Era, Lattice Press, Sunset Beach, CA, pp. 47–48 (1986). (No Month Avail.).

Primary Examiner—Bernard Pianalto
Attorney, Agent, or Firm—Fitzpatrick, Cella, Harper & Scinto

[57] ABSTRACT

A process for preparing an X-ray mask structure comprises an X-ray transmissive film, an X-ray absorptive member held on the X-ray transmissive film and supporting frame for supporting the X-ray transmissive film. The X-ray absorptive member is constituted of crystalline grains having a grain boundary size of 1 μm or larger, or has a density of 90% or more relative to the density of the bulk material.

10 Claims, 5 Drawing Sheets

PROCESS FOR PREPARING AN X-RAY MASK STRUCTURE

This application is a division of application Ser. No. 08/329,787 filed Oct. 27, 1994, which is a continuation of application Ser. No. 08/122,649 filed Sep. 17, 1993, now abandoned, which is a continuation of application Ser. No. 07/727,961 filed Jul. 10, 1991, now abandoned.

BACKGROUND OF THE INVENTION

1. Field of the Invention

This invention relates to an X-ray mask structure to be used for X-ray lithography, a process for preparing the same and an X-ray exposure method by use of said X-ray mask structure.

2. Related Background Art

Various methods have been used in the prior art as the lithographic working method of electronic devices such as IC, LSI, etc., but among them, X-ray lithography is based on the property of high transmittance, short wavelength, etc. inherent in X-ray and has many excellent points as compared with the lithographic methods with visible light or UV-ray hitherto practiced, thus attracting attention as a powerful means for the submicron lithographic method.

Figure 1A:
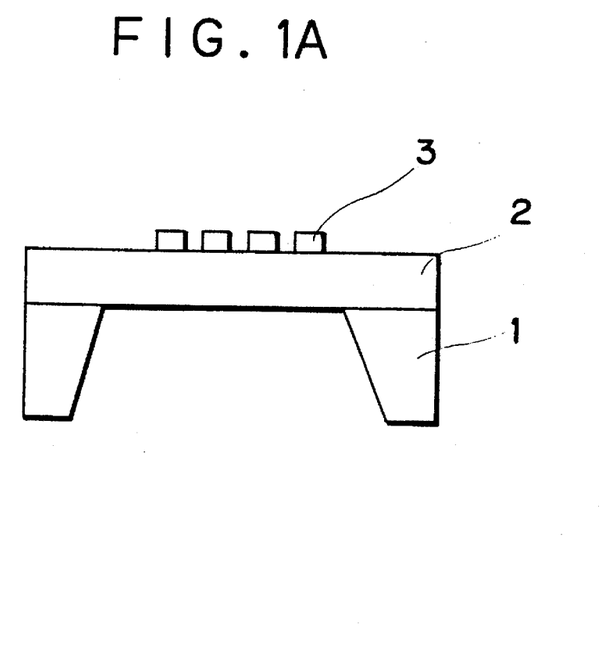
FIGS. 1A and 1B are schematic constitutional views of an X-ray mask structure, FIG. 1A showing its sectional view and FIG. 1B its plan view.
Figure 1B:
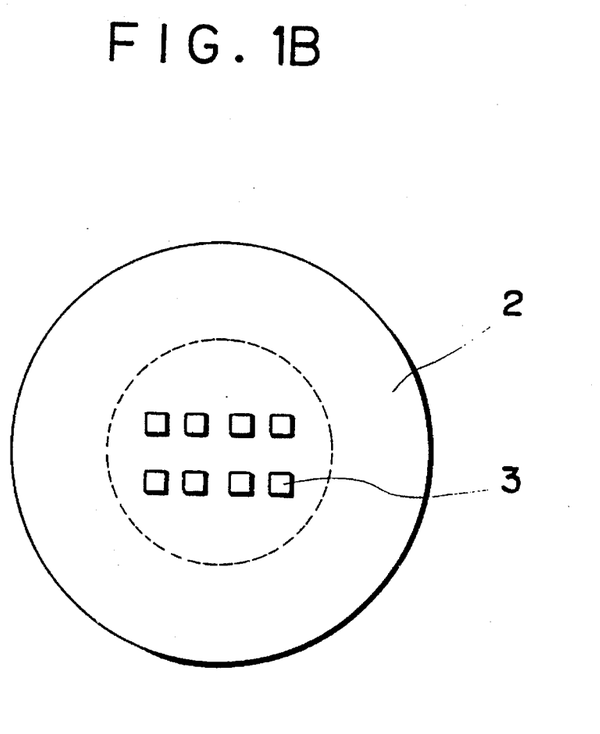

The X-ray mask structure to be used in these X-ray lithographies, for example, as shown in FIGS. 1A and 1B, comprises an X-ray transmissive film 2 supported by spanning on a supporting frame 1, and further an X-ray absorptive member 3 subjected to patterning held on said X-ray transmissive film 2.

In the preparation steps of the X-ray mask structure as shown in FIGS. 1A and 1B, above all the patterning method of the X-ray absorptive member 3 having been practiced in the prior art is a method in which the X-ray absorptive material is deposited onto the X-ray transmissive film 2 according to the sputtering method or the electrolytic plating method, and patterning is carried out by using this in combination with the resist process and the electron beam drawing method.

However, when deposition of the X-ray absorptive material is practiced according to the sputtering method or the electrolytic plating method in the patterning of the X-ray absorptive member as in the above-mentioned prior art example, the following problems have ensued.

First, in patterning of the X-ray absorptive member by use of the sputtering method, there have been involved the following problems:

(1) Since the sputtering method is a physical deposition method based on flying of the particles sputtered from a target through vacuum, no selective deposition (selective growth) of an X-ray absorptive material can be effected on the X-ray transmissive film, and therefore during patterning, two-phase etching treatments of the resist material and the X-ray absorptive material by change-over of the processing gas are required. Therefore, it has been very difficult to effect highly precise patterning of the X-ray absorptive member and control of the shape of stepped portion while suppressing the transfer error of the resist pattern onto the X-ray absorptive member pattern.

(2) In the sputtering method, for controlling the grain boundary size of the grains constituting the X-ray absorptive member, the only factor is the substrate temperature control during sputtering, and hence variance will become greater in performing bulk production.

(3) If the grain boundary size of the material constituting the X-ray absorptive member is desired to be made larger in the sputtering method, the internal stress of the X-ray absorptive member becomes greater, whereby warping will occur after back etching (support frame formation) of the substrate.

On the other hand, in patterning of the X-ray absorptive member by use of the electrolytic plating method, there have been involved the following problems.

(4) Since the electrolytic plating method is essentially a wet treatment, defects of the X-ray absorptive member pattern have been frequently generated because of fine foreign matters in the electrolytic plating solution.

(5) The electrolytic plating method is liable to generate pinholes, convexities on the electrode film (undercoating film), and therefore the electrical field distribution becomes nonuniform during deposition of the X-ray absorptive material, whereby film thickness irregularity, density irregularity of the X-ray absorptive member will give rise to non-uniform distribution in X-ray absorptivity.

Further, the X-ray absorptive member of the prior art is greatly lowered in its density as compared with the bulk density of the material constituting the X-ray absorptive member, whereby the X-ray absorptivity is lowered. Moreover, partly because the edge portion (side surface) of the X-ray absorptive member is not sufficiently smooth, there have ensued undesirable problems such as lowering in resolution, contrast, etc. during printing as the X-ray mask structure to be used for submicron lithography.

SUMMARY OF THE INVENTION

Accordingly, an object of the present invention is to provide an X-ray mask structure holding an X-ray absorptive member with high density and X-ray absorptivity.

Further, it is an object of the present invention to provide an X-ray mask structure and an X-ray exposure method which can form a printed pattern with high resolution, high precision and excellent contrast.

Another object of the present invention is to provide a novel process for preparing an X-ray mask structure, which has solved the problems in the process for preparing an X-ray mask structure of the prior art as described above.

The above objects can be accomplished by the present invention as described below. That is, the present invention is directed to an X-ray mask structure comprising an X-ray transmissive film, an X-ray absorptive member held on said X-ray transmissive film and a supporting frame for supporting said X-ray transmissive film, wherein said X-ray absorptive member is constituted of crystalline grains having a grain boundary size of 1 μm or larger, and also to an X-ray mask structure comprising an X-ray transmissive film, an X-ray absorptive member held on said X-ray transmissive film and a supporting frame for supporting said X-ray transmissive film, wherein said X-ray absorptive member has a density of 90% or more relative to the density of the bulk material constituting said X-ray absorptive member.

Further, the present invention is directed to an exposure method, which comprises irradiating X-ray on a member to be exposed through the X-ray mask structure as specified above.

Further, the present invention is directed to a process for preparing an X-ray mask structure having an X-ray transmissive film, an X-ray absorptive member held on said X-ray transmissive film and a supporting frame for supporting said X-ray transmissive film, wherein the steps for patterning of said X-ray absorptive member comprise a) the step of forming an exposed pattern of an undercoating layer by patterning a side wall material layer on the surface of said undercoating layer, and (b) the step of depositing the X-ray absorptive layer selectively only on the exposed portion of said undercoating layer according to the gas phase growth method.

Further, the present invention is directed to a process for preparing an X-ray mask structure having an X-ray transmissive film, an X-ray absorptive member held on said X-ray transmissive film and a supporting frame for supporting said X-ray transmissive film, wherein the steps for patterning of said X-ray absorptive member comprise a) the step of forming an X-ray transmissive film and then forming an undercoating layer on the surface of said X-ray transmissive film, b) the step of depositing an X-ray absorptive member on the surface of said undercoating layer according to the gas phase growth method, and c) the step of patterning the deposited film of said X-ray absorptive member.

DETAILED DESCRIPTION OF THE PREFERRED EMBODIMENTS

First, the X-ray mask structure of the present invention is explained. The X-ray mask structure of the present invention is an X-ray mask structure shown in FIGS. 1A and 1B, wherein the X-ray absorptive member 3 is characterized by 1) being constituted of crystalline grains having grain boundary sizes of 1 μm or more, or 2) having a density of 90% or more relative to the density of the bulk material constituting the X-ray absorptive member 3.

Initially, to describe in detail the above requirement 1), the X-ray absorptive member which is one of the constitutional requirements of the X-ray mask structure of the present invention is formed of a material known in the art, for example, metal materials with high X-ray absorptivity such as Au, Ta, W, Mo, Cu, etc. or alloy materials of these. However, as compared with the X-ray absorptive member of the prior art, further improvement has been effected with respect to the increase of X-ray absorptivity, because of having larger grain boundary sizes as compared with the X-ray absorptive member of the prior art. Generally speaking, in X-ray mask structures to be used for X-ray lithography, its design rule (i.e. minimum pattern dimensions) is 0.25 μm or less, and therefore in the present invention, the above grain boundary size should be preferably made 1 μm or larger, more preferably 2 μm or larger, particularly 5 μm or larger.

Here, the method for measuring the grain boundary size of the crystalline grains constituting the X-ray absorptive member as described above is briefly described.

The crystallographical difference of the absorptive member formed can be distinguished according to the method as follows. As described in elementary references concerning X-ray diffraction, the angular width of diffracted X-ray will vary depending on the grain size of the crystalline grain as a scattering body. Hence, in the present invention, from the results of conventional X-ray diffraction, namely from the measurement of the angular width B (radian) of the diffracted ray profile obtained from the X-ray diffraction chart, the grain boundary size t (μm) of the crystalline grains constituting the X-ray absorptive member was calculated by using the following formulae (A), (B):

$$2d \sin \theta_B = m \lambda \ldots \quad (A)$$

$$t = 0.9 \lambda / B \cos \theta_B \ldots \quad (B)$$

In the above formulae (A), (B), d represents the lattice constant of the absorptive member crystalline grains (nm), and $\theta_B$ the Bragg angle of the diffracted ray (radian), λ wavelength (nm) (m=1). For the above d, the value described in the ASTM card was employed.

For those in which grain boundary sizes appeared to exceed 1 μm, the cross-section of the coating film was observed by using a high resolution type scanning electron microscope, and the average grain boundary size was determined by comparison with standard samples.

Next, to describe the details about the above requirement 2) which is the second embodiment of the X-ray mask structure of the present invention, such X-ray absorptive member is also formed of the material known in the art as described above, but since it has higher density as compared with the X-ray absorptive member of the prior art, further improvement has been also effected with respect to increase of X-ray absorptivity. The higher density as mentioned above means especially a density approximate to the density of the bulk material constituting the X-ray absorptive member, preferably 90% or more of the density.

Here, the method for measuring the density of the X-ray absorptive member as described above is briefly described. The density $\beta_A$ (g/cm³) of the X-ray absorptive member in the present invention was determined by irradiating the X-ray mask structure with an X-ray, for example, $CuK_\alpha$ ray, wavelength 1.54 Å, measuring the X-ray intensities transmitted through the X-ray absorptive member and the X-ray transmissive film (respectively defined as $I_A$ and $I_m$ (%)), and the thickness $d_A$ (μm) of the X-ray absorptive member, and calculating the coefficient of X-ray absorption $\mu_A$ (μm⁻¹) of the X-ray absorptive member according to the formula (C) shown below and calculating the density from such $\mu_A$ value by use of the formula (D) shown below:

$$I_m/I_A = e^{\mu_A d_A} \ldots \quad (C)$$

$$\beta_A = (\mu_A/\mu_B) \beta_B \quad \ldots (D)$$

In the above formulae (C) and (D), $\mu_B$ and $\beta_B$ represent the X-ray absorption coefficient (μm⁻¹) and the density (g/cm³) of the bulk material constituting the X-ray absorptive member, and for these values, those described in the ASTM card were employed. The ASTM card gives densities and X-ray absorption coefficients of materials which are in the form of single-crystal.

X-ray absorptive members satisfying the above requirement 1) or 2) have large X-ray absorptivity similar to the bulk materials, and therefore the X-ray mask structure holding such X-ray absorptive member is by far superior as compared with that of the prior art with respect to the contrast of the printed pattern of wafer (member to be exposed), resolution, etc. in X-ray lithography.

Further, the X-ray mask structure of the present invention, for the same reasons as described above, is preferably an embodiment such that said X-ray absorptive member 3 is 1) constituted of crystalline grains having grain boundary sizes of 1 μm or larger and 2) has a density of 90% or more relative to the bulk density of the material constituting the X-ray absorptive member 3. That is, the above conditions 1) and 2) are not necessarily equal, and the embodiment capable of satisfying both conditions is a particularly preferable embodiment.

The above X-ray absorptive member in the present invention should be preferably formed to a thickness within the range so that the transmittance of the exposed X-ray may be 10% or less of the transmissive film, but the X-ray absorptive member should be particularly preferably formed as thin as possible with respect to the run-out error by the obliquely incident X-ray, etc. In this respect, the above-X-ray absorptive member in the present invention is improved in X-ray absorptivity as compared with the prior art, and therefore it can be formed thin to accord with the above-mentioned particularly preferable range, and at the same time such demands as run-out error, etc. as mentioned above can be satisfied.

In addition, in the X-ray mask structure of the present invention, the X-ray transmissive film 2 (FIGS. 1A and 1B) may be one comprising any combinaton of materials which can transmit X-ray, as for example, Be, B, C, N, Al, Si, etc., but preferably with respect to Young's modulus, thermal expansion coefficient, visible light transmittance, etc. of the material, it should be desirably formed of SiN, SiC, etc. Also, the film thickness of the above X-ray transmissive film is not particularly limited, but is preferably made within the range of 1 to 3 m, particularly 1 to 2 μm. Further, the above X-ray transmissive film is not limited to the film comprising a single layer, but may be also formed of a multi-layer laminated film having also a film comprising a material such as $SiO_2$ or polyimide, etc. for the purpose of preventing reflection or strengthening of the film.

Further, in the X-ray mask structure of the present invention, the supporting frame 1 for supporting the above X-ray transmissive film 2 (FIG. 1A) comprises a glass such as pyrex, etc. or a material such as single crystalline silicon, metallic titanium and alloys thereof, etc. formed in a ring shape.

Having described above the details about the constitution of the X-ray mask structure of the present invention, description is now made about the process for preparing the X-ray mask structure of the present invention.

Concerning the preparation process of the present invention, two embodiments are described in detail below.

First, in the preparation process of the present invention, in either one of the embodiments as described below, the X-ray transmissive film and the supporting frame for supporting said X-ray transmissive film may be prepared according to the methods known in the prior art. More specifically, to describe the X-ray transmissive film, for its film deposition method, the gas phase growth method, etc. may be employed, and the film is deposited to a film thickness within the range of 1 to 3 μm. Here, as the material for forming the X-ray transmissive film, there may be employed a material which can transmit X-ray, for example, one comprising any combination of materials such as Be, B, C, N, Al, Si, etc., but with respect to Young's modulus, thermal expansion coefficient, visible light transmittance, etc., it should be preferably made of SiN, SiC, etc. Further, the above X-ray transmissive film is not limited to the film comprising a single layer, but, for example, it may be also formed of a multi-layer laminated film having in addition a film comprising a material of $SiO_2$ or polyimide, etc. for the purpose of preventing reflection or strengthening of the film.

To describe the supporting frame, there may be employed the method in which it is adhered to the X-ray transmissive film with an adhesive after deposition of the X-ray transmissive film (further X-ray absorptive member), or the method in which after deposition of the X-ray transmissive film (further the X-ray absorptive member), the substrate is formed into a frame (ring) by etching treatment. Here, the supporting frame is made of a glass such as pyrex, etc. or a material such as single crystalline silicon, metallic titanium and alloys thereof. etc.

First, in the first embodiment (hereinafter called the present process (I)), the preparation process of the present invention is a process for preparing an X-ray mask structure, wherein above all the step for forming the X-ray absorptive member has the step Ia) and the step Ib) as described below, namely:

Ia) the step of patterning a side wall material on the surface of an undercoating layer, thereby forming an exposed pattern of said subbing layer;

Ib) the step of depositing an X-ray absorptive material selectively only on the exposed portion of said subbing layer according to the gas phase growth method.

First, in the above step Ia), for the material constituting the subbing layer, an electron donative material is used.

The electron donative material refers to a material in which free electrons exist in the substrate, or free electrons are intentionally transferred, as for example, a material having the surface which accelerates the chemical reaction through electron transfer with the starting gas molecules adsorbed on the substrate surface. For example, generally metals and semiconductors correspond to this. Those having thin oxide films existent on metal or semiconductor surfaces are also included. That is because the chemical reaction occurs through give-and-take of electrons between the substrate and the attached starting material molecules.

More specifically, there may be included semiconductors such as single crystalline silicon, polycrystalline silicon, amorphous silicon, etc., binary or ternary or quaternary Group III–V compound semiconductors comprising combinations of Ga, In, Al as the group III element and P, As, N as the group V element, metals, alloys and silicides of them, such as tungsten, molybdenum, tantalum, tungsten silicide, titanium silicide, aluminum, aluminum silicon, titanium aluminum, titanium nitride, copper, aluminum silicon copper, aluminum palladium, titanium, molybdenum silicide, tantalum silicide gold, etc.

For the material constituting the side wall material in the above step Ia), a non-electron donative material is used, and as said non-electron donative material, there may be included silicon oxide formed by thermal oxidation, CVD, etc., glasses such as BSG, PSG, BPSG, etc., or oxide films, thermally nitrided films, silicon nitride films formed by plasma CVD, reduced pressure CVD, ECR-CVD method, etc.

Further, the gas phase growth method to be used in the above step Ib) may be preferably the CVD method.

The deposition mechanism of the X-ray absorptive material in the above step Ib) in the present process (I) may be considered as follows.

That is, in the CVD method, the starting gas molecules for deposition of the X-ray absorptive member undergo the chemical reaction only on the undercoating layer surface comprising an electron donative material capable of electron transfer, and are deposited with a certain crystal orientation, but will not be deposited on the side wall material surface comprising a non-electron donative material. Hence, in the above step Ib), the X-ray absorptive materials are deposited selectively at the exposed portion of the subbing layer, namely the portion with its surface not covered with the side wall material.

For example, the deposition mechanism of tungsten (W) according to the CVD method, when poly Si is used as the subbing layer, $SiO_2$ as the side wall material, and $WF_6$ as the reactive gas, the following chemical reaction occurs only on the surface (exposed portion) of the subbing layer having electron donative characteristic:

$$WF_6 + Si \rightarrow W + SiF_4$$

to deposit W. On the other hand, on the surface of the side wall material, no such chemical reaction as above will occur and therefore no W will be deposited.

As described above, since deposition occurs through the chemical reaction on the electron donative material surface, uniformity of the film is good and also a dense film can be obtained. In summary, an X-ray absorptive member with small internal stress and good X-ray absorptivity can be obtained.

Next, the preparation process of the present invention according to the second embodiment (hereinafter called the present process (II)) is characterized in that particularly the steps of forming the X-ray absorbing member in the process for preparing an X-ray mask structure has the following step IIa), the step IIb) and the step IIc), namely:

IIa) the step of forming an X-ray transmissive film and then forming an undercoating layer on the surface of said X-ray transmissive film;

IIb) the step of depositing an X-ray absorptive material on the surface of said undercoating layer according to the gas phase growth method; and IIc) the step of patterning the deposited film of said X-Fay absorptive material.

First, in the above step IIa), for the material constituting the undercoating layer, the electron donative material as described above is employed. In the present process (II), the thickness of the subbing layer may be preferably made 100 ↑ to 1000 Å.

Further, the gas phase growth method to be used in the above step IIb) may be preferably the CVD method.

The deposition mechanism of the X-ray absorptive material in the above step IIb) in the present process (II) may be considered similarly as in the present process (I).

That is, in the CVD method, the starting gas molecules for formation of the X-ray absorptive member undergo the chemical reaction only on the subbing layer surface comprising an electron donative material capable of electron transfer, and are deposited with a certain crystal orientation.

In the present process (II), above all, by having the above steps IIa), IIb), namely by depositing the X-ray absorptive material through the chemical reaction on the electron donative material surface as described above, the uniformity of the film is good, and also a dense film can be obtained. That is, an X-ray absorptive member with small internal stress and good X-ray absorptivity can be obtained.

Also, in the present process (II), the above step IIc) performs a desired patterning of the deposited film of the X-ray absorptive material formed on the subbing layer surface according to the above steps IIa), IIb) by using in combination the resist process and the electron beam drawing method known in the prior art. However, in carrying out such patterning of the deposited film of the X-ray absorptive material, the subbing layer may be subjected to patterning at the same time to form the exposed portion of the X-ray transmissive film, or alternatively patterning may be limited only to the X-ray absorptive material, with the subbing layer remaining on the whole surface of the X-ray transmissive film.

In the present processes (I) and (II) as described above, the X-ray absorptive layer is made of materials known in the prior art, for example, metals with high X-ray absorptivity such as Au, Ta, W, Mo, Cu, etc. or alloys of these.

The ratio of the thickness of the deposited film of said X-ray absorptive material to the thickness of said subbing layer should be preferably made in the present process, particularly so that the thickness of the subbing layer may be 1% to 14% of the thickness of the deposited film of the X-ray absorptive material.

In the present processes (I) and (II), as described previously, the material for forming the X-ray transmissive film may be also Si, and in this Si, one having electricconductivity, namely one corresponding to the above-described electron donative material exists. However, in the present processes (I) and (II), even when such electroconductive Si material may be employed, provision of the subbing layer as described above is a particularly preferable embodiment. That is, Si film is liable to form an oxide coating ($SiO_2$) on the surface during its film formation step, and the coating will lower the deposition efficiency of the X-ray absorptive material according to the above chemical reaction. Hence, for the X-ray absorptive member to have sufficient characteristics as mentioned above, it is particularly preferable to have the subbing layer formation as the essential step.

Also, the present processes (I) and (II) are particularly effective when preparing an X-ray mask structure in which the X-ray transmissive film is SiN or SiC. As described previously, formation of the X-ray transmissive film of SiN or SiC is preferable with respect to Young's modulus, thermal expansion coefficient, visible light transmittance, etc. However, since SiN and SiC are non-electron donative materials, no X-ray absorptive material can be deposited according to the above gas phase growth on such X-ray transmissive film surface. In the present process, after formation of the subbing layer, the X-ray absorptive material is deposited by the above chemical reaction on such subbing layer surface, and therefore even when a non-electron donative material such as SiN, SiC, etc. may be employed as the X-ray transmissive film material, an X-ray absorptive member can be formed while maintaining the above characteristics possessed by the X-ray transmissive film of SiN, SiC, and yet having the above-mentioned desirable characteristics.

The present invention is described in more detail below by referring to Examples and Comparative examples.

EXAMPLE 1

Figure 2A:
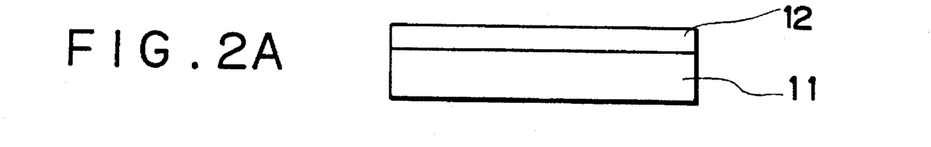
FIGS. 2A, 2B, 2C, 2D, 2E, 2F and 2G, FIGS. 3A, 3B, 3C, 3D and 3E, FIGS. 4A, 4B, 4C, 4D, 4E and 4F, FIGS. 5A, 5B, 5C, 5D, 5E and 5F are illustrations for explaining the process for preparing the X-ray mask structure of the present invention.
Figure 2B:
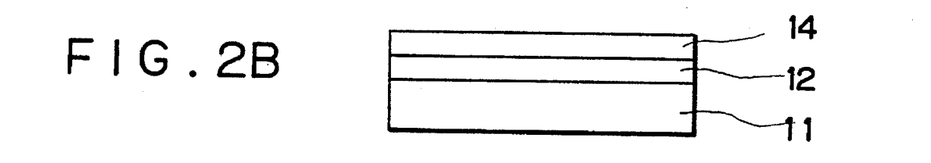
Figure 2C:
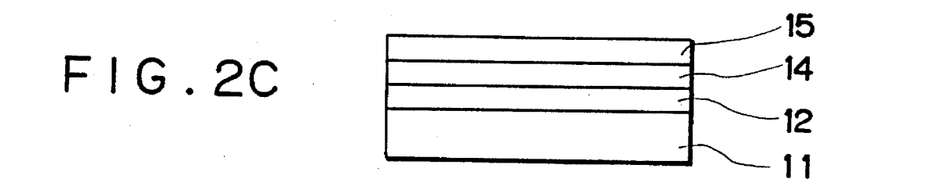

On a silicon wafer 11 having fairly good flatness (TIR 2 μm or less, NTV 2 μm or less), a $SiN_x$ film 12 which becomes the X-ray transmissive film was formed to a thickness of 2 μm (FIG. 2A) according to the LPCVD method under the following conditions:

| | |
|---|---|
| Dichlorosilane $SiH_2Cl_2$ | 100 SCCM |
| Ammonia $NH_3$ | 500 SCCM |
| Pressure | 0.3 Torr |
| Deposition rate | 180 Å/min. |
| Deposition temperature | 800° C. |

The internal stress of the X-ray transmissive film 12 formed had a value of 5 to $7 \times 10^8$ dyn/cm², which was a sufficiently small value. Next, the above silicon wafer was placed similarly in the LPCVD apparatus, and a TiN film as the electron donative member was deposited according to the CVD by use of Ti(N(CH$_3$)$_2$)$_4$ and NH$_3$ to 700 Å to, form a subbing film 14 (FIG. 2A). Then, in a conventional normal pressure CVD apparatus, SiO$_2$ as the side wall material 15 was deposited to 1.0 µm by the reaction between SiH$_4$ and O$_2$ at 420° C., and heat treatment was applied in N$_2$ atmosphere at 950° C. for 30 minutes to densify the film for later anistropic etching.

Figure 2D:
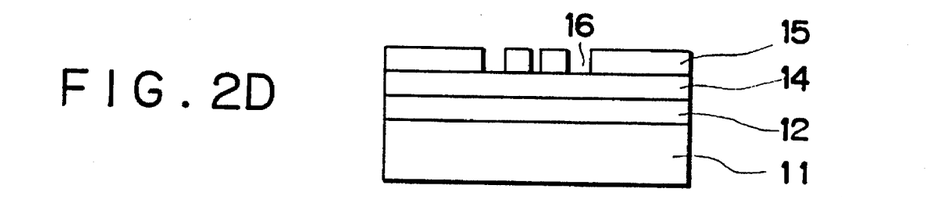

Next, on the above side wall material 15, a resist of the PMMA type (trade name: DEBR-1000, Tokyo Oka) was coated to 1 µm, and after pre-baking, exposed according to the electron beam drawing method, followed by developing and post-baking. Then, patterning of the side wall material 15 was effected by carrying out the dry etching treatment of SiO$_2$ in F plasma, to form an exposed pattern 16 of the subbing layer 14 (FIG. 2D).

For controlling the stepped shape (stepped profile) of the X-ray absorptive member at this time, any desired stepped shape can be obtained by control of:

1. temperature and time during post-baking;
2. mixing of O$_2$ during etching; or
3. whole surface irradiation of O$_2$ plasma before etching; or the like. Next, the above silicon wafer is placed in the LPCVD apparatus, and an X-ray absorptive member 13 was formed according to the silane reduction method of WF$_6$ under the following conditions:

| | |
|---|---|
| Partial pressure of WF$_6$ | 2 × 10$^{-3}$ Torr; |
| SiH$_4$ partial pressure | 1.5 × 10$^{-3}$ Torr; |
| Growth temperature and | 360° C.; |
| H$_2$ | 96.5 mTorr. |

The X-ray absorptive member 13 with a film thickness of 0.85 µm was formed only on the exposed portion 16 of the subbing layer 14 as described above (FIG. 2E).

Figure 2E:
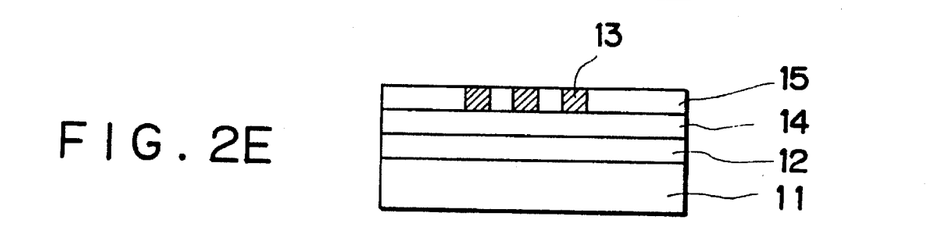
Figure 2F:
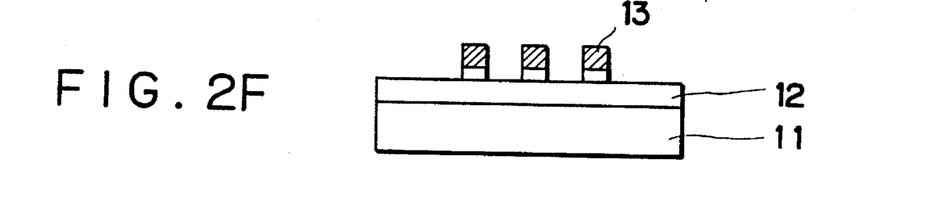

As the next step, the SiO$_2$ 15 as the side wall material was removed with a hydrofluoric acid type etchant, and then the exposed TiN film 14 was removed with fluorine plasma (FIG. 2F).

In this step, preferably the SiO$_2$ 15 and the TiN film 14 should be removed with fluorine plasma at the same time.

Figure 2G:
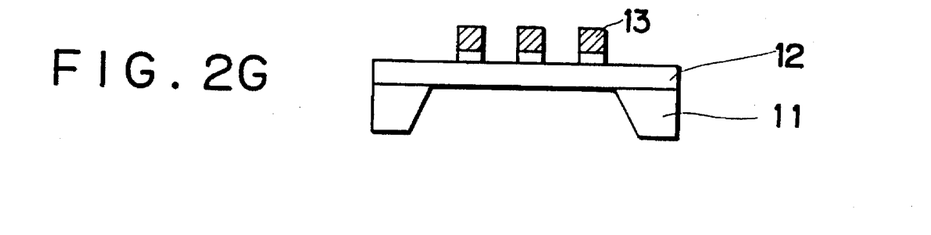

Finally, by removing partially the silicon wafer 11 by back etching, a supporting frame was formed (FIG. 2G).

The X-ray mask structure of the present invention prepared as described above is called X-ray mask structure (A).

EXAMPLE 2–4

X-ray mask structures (B)–(D) were formed in the same manner as in Example 1 except for forming the X-ray absorptive member under the conditions shown below:

| X-ray mask structure | Apparatus | Material gases | Carrier gas | Growth temperature |
|---|---|---|---|---|
| (B) condition 1 | LP CVD | (n-C$_3$H$_7$)$_2$AuCl | H$_2$ | 110° C. |
| (C) condition 2 | LP CVD | (n-C$_3$H$_7$)$_2$AuBr | H$_2$ | 100° C. |
| (D) condition 3 | LP CVD | (n-C$_4$H$_9$)$_2$AuBr | H$_2$ | 70° C. |

EXAMPLE 5

In FIGS. 2A to 2G, an X-ray mask structure (E) was prepared except for forming the undercoating film 14 of Mo, using a sputtering method, to a thickness of 500 Å and forming as the X-ray absorptive member 13, a Mo film with a thickness of 0.85 µm under the conditions of a partial pressure of Mo(CO)$_6$ of 2×10$^{-4}$ Torr, reactive gas H$_2$ (partial pressure 1.5 Torr), and a growth temperature of 450 ° C.

EXAMPLE 6

Figure 5A:
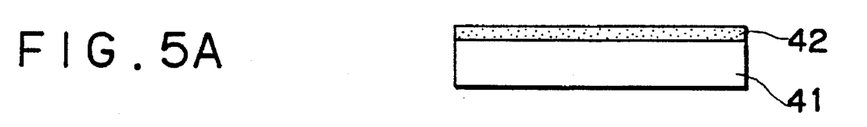

On a silicon wafer 41 having fairly good flatness (TIR 2 µm or less, NTV 2 µm or less), a SiN$_x$ film 42 which becomes the X-ray transmissive film was formed to a thickness of 2 µm (FIG. 5A) using the LPCVD method under the following conditions:

| | |
|---|---|
| Dichlorosilane SiH$_2$Cl$_2$ | 100 SCCM |
| Ammonia NH$_3$ | 500 SCCM |
| Pressure | 0.3 Torr |
| Deposition rate | 180 Å/min. |
| Deposition temperature | 800° C. |

Figure 5B:
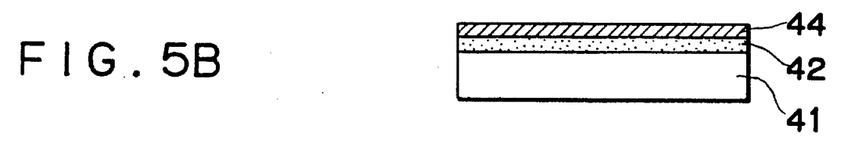

The internal stress of the X-ray transmissive film 42 formed had a value of 5 to 7×10$^8$ dyn/cm$^2$, which was a sufficiently small value. Next, the above silicon wafer was placed similarly in the LPCVD apparatus, and a TiN film as the electron donative member was deposited by CVD with gases of Ti(N(CH$_3$)$_2$)$_4$ and NH$_3$ to 700 Å to form a undercoating film 44 (FIG. 5B).

Figure 5C:
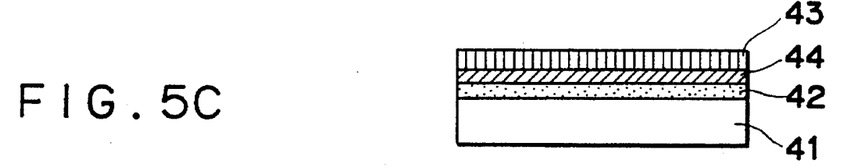

Next, the above silicon wafer was placed in the LPCVD apparatus, and a deposition film of X-ray absorptive material 43 was formed by the silane reduction method of WF$_6$ under the following conditions:

| | |
|---|---|
| Partial pressure of WF$_6$ | 2 × 10$^{-3}$ Torr; |
| SiH$_4$ partial pressure | 1.5 × 10$^{-3}$ Torr; |
| Growth temperature and | 360° C.; |
| H$_2$ | 96.5 mTorr. |

A deposition film 43 with a film thickness of 0.85 µm was formed on the whole surface of the subbing layer 44 as described above (FIG. 5C).

Figure 5D:
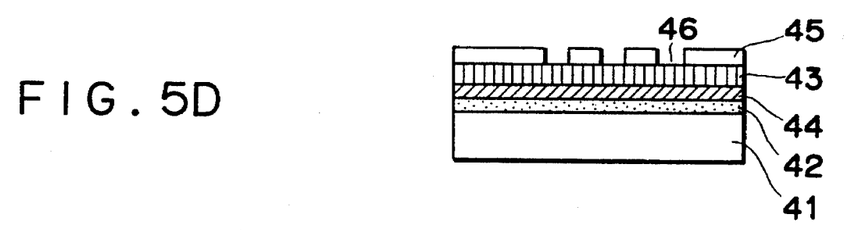

Then, in a conventional normal pressure CVD apparatus, SiO$_2$ was deposited to 1.0 µm as the intermediate layer 45 by the reaction between SiH$_4$ and O$_2$ at 420° C., and the heat treatment was applied in N$_2$ atmosphere at 950° C. for 30 minutes to densify the film for the later anisotropic etching process.

Next, on the above intermediate layer 45, a resist of the PMMA type (trade name: DEBR-1000, Tokyo Oka) was coated to 1 µm, and after pre-baking, exposed by the electron drawing method, followed by developing and post-baking. Then, patterning of the intermediate layer 45 was effected by carrying out the dry etching treatment of SiO$_2$ in F plasma, to form an exposed pattern 46 of the above deposition film 43 (FIG. 5D).

Next, the deposited film 43 of the X-ray absorptive material was subjected to etching treatment with fluorine plasma.

Figure 5E:
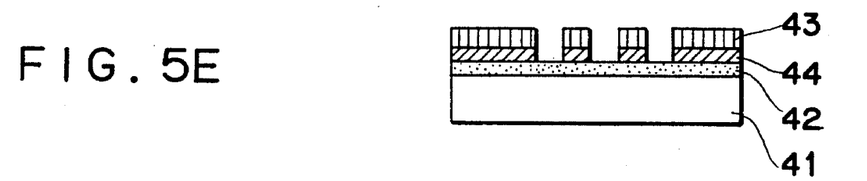

As the next step, the SiO$_2$ 45 as the intermediate layer was removed with a hydrofluoric acid type etchant, and then the exposed TiN film 44 was removed with fluorine plasma (FIG. 5E).

In this step, preferably the SiO$_2$ 45 and the TiN film 44 should be removed with fluorine plasma at the same time.

Figure 5F:
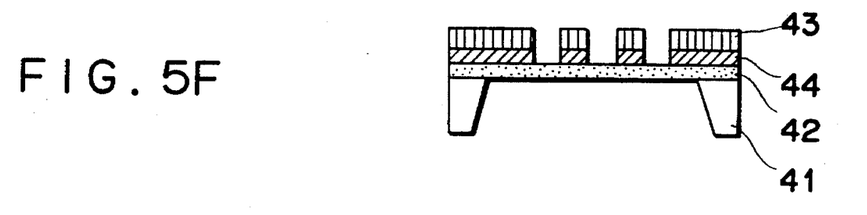

Finally, by removing partially the silicon wafer 41 by back etching, a supporting frame was formed (FIG. 5F).

The X-ray mask structure of the present invention prepared as described above is called X-ray mask structure (F).

EXAMPLE 7–9

X-ray mask structures (G)–(I) were formed in the same manner as in Example 6 except for forming the X-ray absorptive member according to the CVD method under the conditions shown below:

| X-ray mask structure | Apparatus | Material gases | Carrier gas | Growth temperature |
|---|---|---|---|---|
| (G) condition 1 | LP CVD | $(n\text{-}C_3H_7)_2$ AuCl | $H_2$ | 110° C. |
| (H) condition 2 | LP CVD | $(n\text{-}C_3H_7)_2$ AuBr | $H_2$ | 100° C. |
| (I) condition 3 | LP CVD | $(n\text{-}C_4H_9)_2$ AuBr | $H_2$ | 70° C. |

EXAMPLE 10

In FIGS. 5A to 5F, an X-ray mask structure (J) was prepared in the same manner as in Example 6 except for forming the undercoating film 44 of Mo, by the sputtering method to a thickness of 500 Å and forming as the X-ray absorptive member 43, a Mo film with a thickness of 0.85 μm under the conditions of a partial pressure of $Mo(CO)_6$ of $2\times10^{-4}$ Torr, reactive gas $H_2$ (partial pressure 1.5 Torr), and a growth temperature of 450 ° C.

EXAMPLE 11

In FIGS. 5A to 5F, an X-ray mask structure (K) was prepared in the same manner as in Example 6 except for forming the $SiC_x$ film as the X-ray transmissive film 42 to a thickness of 2 μm according to the LPCVD method.

Comparative Example 1

Following the steps in FIGS. 2A to 2G similarly as in Examples 1–5 as described above, except for performing the step of the absorptive member formation of FIG. 2E by gold plating practiced in the prior art, the steps to the final process were completed to form an X-ray mask structure (a). When the surface of the absorptive member after completion was observed by a scanning electron microscope, unevenness of 0.1 to 0.5 μm in terms of P-V value of height was seen. This surpassed greatly the specification demanded for the thickness irregularity of the absorptive member.

Comparative Example 2

A silicon nitride film SiN which becomes the X-ray transmissive layer was deposited to a thickness of 2 μm in the same manner as in the Examples of the present application. Next, a tungsten film which becomes the X-ray absorptive member was formed by sputtering to a thickness of 0.85 μm by use of a magnetron sputtering apparatus under the condition of Ar 10 mTorr, $N_2$ 3 mTorr. Then, passing through the resist step, EB drawing, etching of W with $CF_4$ were performed to form an X-ray mask structure(b).

When the surface of the X-ray absorptive member completed was observed by a scanning electron microscope, the surface was smooth and amorphous, but the density measured was found to be only 78% of the bulk value.

Reference Examples

For the X-ray mask structures (A) to (K), (a), (b) prepared in the above Examples 1 to 10 and Comparative examples 1 and 2, (1) the grain boundary sizes of the crystalline grains constituting the X-ray absorptive member, and (2) the densities of the X-ray absorptive membranes were measured according to the methods as described below.

As to the crystalline grain boundary size of the X-ray absorptive member, there were employed the two methods of evaluating the diffraction ray angle width of X-ray diffraction and observation by the high resolution scanning electron microscope. When the grain boundary size exceeds 1 μm, the width of the diffraction ray becomes about 30 angle.sec, whereby measurement cannot be done easily. Accordingly, when the grain boundary size appears to be 1 μm or more, the cross-section of the film is observed by high resolution scanning electron microscope and compared with the standard sample to determine the size.

As to the density of the X-ray absorptive member, it was determined by calculation from the transmittance measurement as described in the present specification.

The grain boundary sizes and densities of the X-ray absorptive members determined according to the methods as described above are shown in Table 1.

TABLE 1

| Sample | Average grain boundary size | Ratio of bulk density |
|---|---|---|
| (A) (F) (K) | 2.8 μm | 93.0% |
| (B) (G) | 2.5 | 92.8 |
| (C) (H) | 1.4 | 92.1 |
| (D) (I) | 1.6 | 92.3 |
| (E) (J) | 2.4 | 92.8 |
| (a) | 0.3 | 82.0 |
| (b) | amorphous | 78.0 |

AS is apparent from Table 1, the grain boundary sizes of the X-ray absorptive member obtained by the methods of the prior art will never be 1 μm or larger, while those according to the present Examples are 1 μm or larger at the least, most of them having grain sizes of 2 μm or larger. The X-ray absorptive member density which is important for fulfillng the function as the X-ray absorptive member was 90% OF lower of the bulk density in the prior art, while it was 90% or higher according to the method of the present invention.

In X-ray an exposure apparatus, it frequently occurs that scattering of the illumination light for exposure cannot be avoided, whereby run-out is generated, but it is also important that the absorptive member thickness should be as thin as possible, for the reduction of runout error and high density contributes to reducing the thickness of the X-ray absorptive member.

Because the transferred pattern size is about 1 μm to 0.2 μm, large grain boundary size will result in formation of the pattern within a single grain boundary size, whereby the X-ray leaked through the grain boundary of the X-ray absorptive member is sufficiently small and the intensity is uniform.

EXAMPLE 12

By use of the X-ray mask structures (A)–(K) as decribed above, X-ray exposure was effected under the following conditions.
(Exposure Condition)

| Exposure gap (Wafer-mask distance) | 50 μm |
|---|---|
| Atmosphere Reduced pressure He | 150 Torr |
| X-ray intensity | 150 mW/cm$^2$ |
| Exposure time | 1.2 sec. |
| Resist (RAY-PN; Hoechst) | 1 μm |

The results of the above X-ray exposure were evaluated. When compared with the case by use of a mask subjected to dry etching of a W film uniformly deposited (the case of Comparative example 2), the transferred resist pattern with the W-dry etching mask has little unevenness at the edge portion, while in the mask of the present invention having W buried by dry etching of SiO$_2$, the edge shape of the resist pattern transferred is extremely smooth, with substantially no change of line width being seen.

EXAMPLE 13

In Examples 1 to 5 as described above, X-ray absorptive members were formed by varying the stepped difference shape of the side wall material 15 as shown in FIGS. 3A, 3B, 3C, 3D and 3E.

Figure 3A:
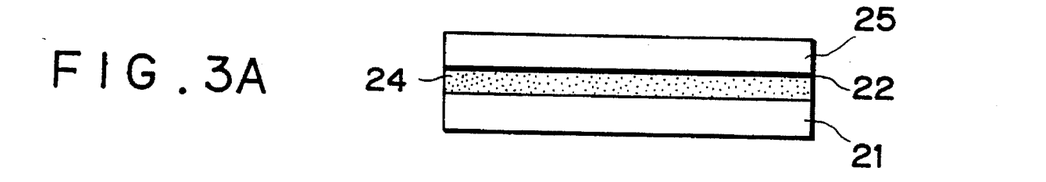
Figure 3B:
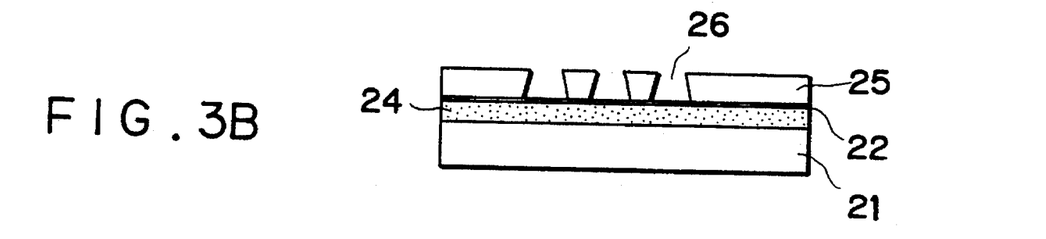
Figure 3C:
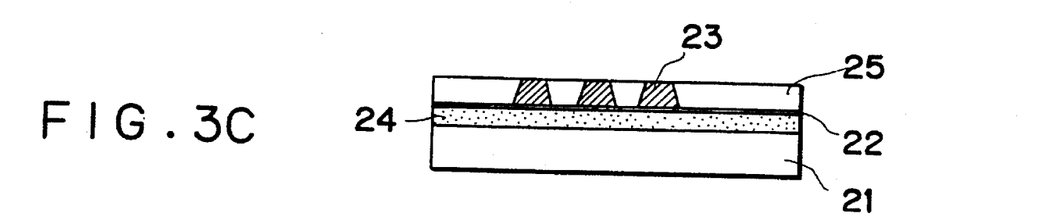
Figure 3D:
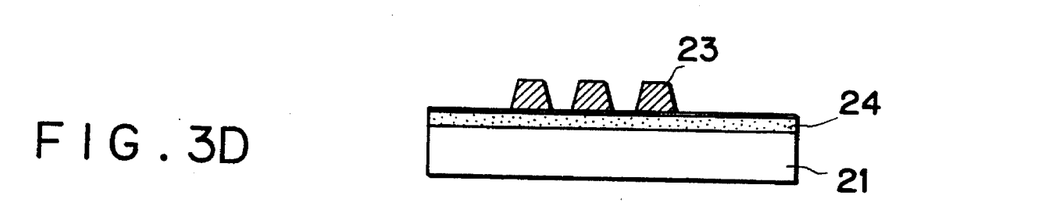

After lamination of the X-ray transmissive film material layer 24 similarly as in Example 1, an electroconductive layer 22 was formed, and SiO$_2$ 25 which becomes the side wall material was deposited to be an amorphous film (FIG. 3A). During formation of the opening wherein the X-ray absorptive member is to be buried, plasma etching was applied under the conditions so as to make anisotropy small, thereby providing the opening 26 having undercut (FIG. 3B).

Figure 3E:
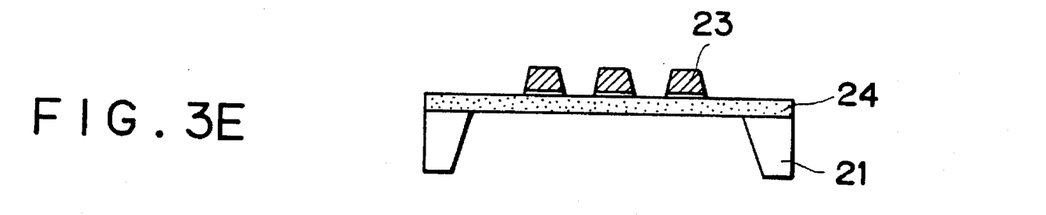

Then, similarly as in Example 1, the X-ray absorptive member was subjected to the gas phase growth (FIG. 3C), and after removal of the side wall material and the electroconductive layer (FIG. 3D), the substrate silicon 21 was back-etched to obtain an X-ray mask structure having a tapered slope of the absorptive material (FIG. 3E).

Thus, in the present invention, the stepped shape of the X-ray absorptive member can be easily varied from the vertical stepped shape of 90° to the stepped shape having a taper angle of 60° by varying the stepped shape of the side wall material. Further, CVD-SiO$_2$ is employed for the side wall material, an amorphous layer can be laminated, and therefore the wall surface after patterning was smooth and the side surface of the X-ray absorptive member was found to be excellent in smoothness.

In the Examples as described above, X-ray absorptive member patterns were formed on the X-ray transmissive film, but for making the thickness of the X-ray absorptive member particularly uniform to make the surface smooth, X-ray mask structure was formed according to the method as shown in FIGS. 4A to 4F.

Figure 4A:
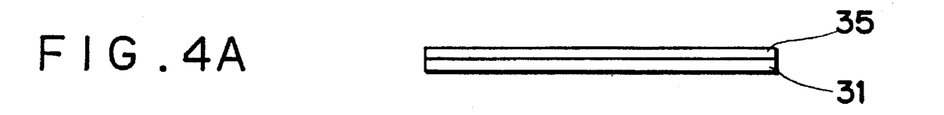
Figure 4B:
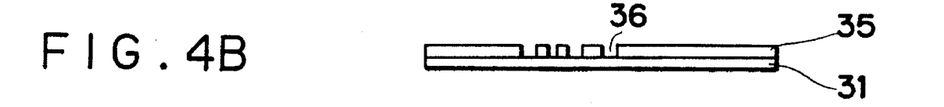
Figure 4C:
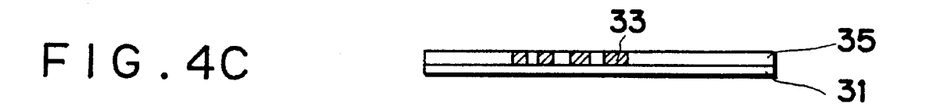

That is, at first a silicon wafer 31 is prepared having the silicon surface exposed by surface polishing, a SiO$_2$ layer 35 is deposited on its surface (FIG. 4A), the SiO$_2$ where the X-ray absorptive member is to be arranged is removed by etching, etc. to form an opening 36 (FIG. 4B). At that time, at the portion of 36 which reaches the substrate, silicon is made to appear. Next, according to the selective gas phase growth method wherein the reaction occurs on the electron donative surface, an X-ray absorptive member 33 is allowed to grow internally of the opening to be deposited to the same thickness as the surface of the SiO$_2$ layer (FIG. 4C). Since SiO$_2$ is an insulator, no X-ray absorptive member will be deposited on its surface, but it becomes possible to form the absorptive member following faithfully the wall surface shape of SiO$_2$ only at the opening portion.

Figure 4D:
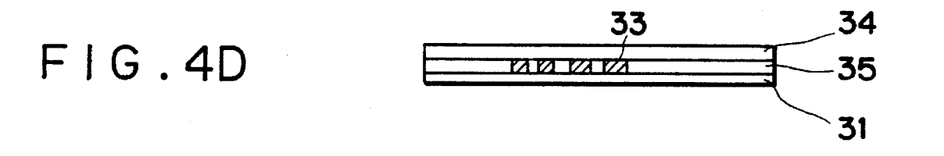

Next, on the SiO$_2$ buried with the X-ray absorptive member is formed an X-ray transmissive film 34 according to the non-selective gas phase growth method, etc. (FIG. 4D). Since the SiO$_2$ layer 35 is ordinarily made to have a thickness of 1 μm or less, the surface of 35 still maintains the surface precision of the silicon substrate 31. The X-ray transmissive film should desirably have excellent radiation resistance, also high mechanical strength, and further high transmittance to visible or IR light for alignment. It is necessary to determine its thickness so as to suppress the lowering in strength by absorption of X-ray to at most 50% or less, and satisfy the conditions to be possessed by the X-ray transmissive film as previously mentioned. Also, it is necessary to strictly control the thickness irregularity of the X-ray transmissive film, because it will lead directly to the illuminance irregularity of the exposed X-ray.

Figure 4E:
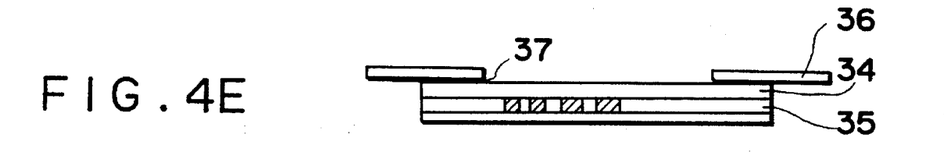

After formation of the X-ray transmissive film, the supporting frame 36 is secured onto the X-ray transmissive film 34 with an adhesive 37, etc. (FIG. 4E). Desirably, the adhesive should be the type which is shrinked during curing so that a tensile tension can be imparted to the X-ray transmissive film 34 after securing with the supporting frame. Alternatively, when another method is employed, such method is required to impart a tensile stress after fixation.

Figure 4F:
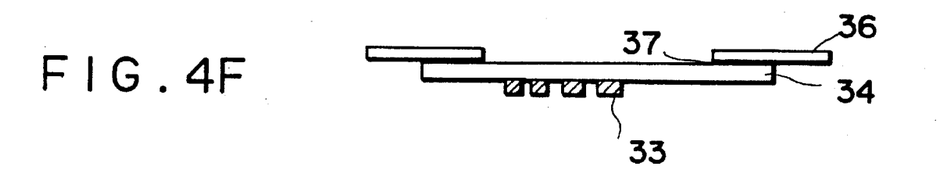

After the support is secured, when the silicon substrate 35 and the SiO$_2$ 34 are removed according to such method as etching, etc., an X-ray mask structure having the X-ray transmissive film fixed on the supporting frame is formed (FIG. 4F).

EXAMPLE 14

On a silicon wafer 31 having fairly good flatness (TIR 2 μm or less, NTV 2 μm or less), SiO$_2$ was deposited as the side wall material 35 to 0.85 μm in a normal pressure CVD apparatus by the reaction between SiH$_4$ and O$_2$ at 420° C., and the heat treatment in N$_2$ atmosphere at 950° C. for 30 minutes was applied to densify the film for later anisotropic etching (FIG. 4A).

Next, on the above side wall material 35 was coated a resist of the PMMA type (trade name: DEBR-1000, Tokyo Oka) to 1 μm, pre-baking was carried out and then exposure according to the electron beam drawing method, followed by developing and post-baking. Further, the side wall material 35 was subjected to patterning by effecting the etching treatment of the SiO$_2$ by the dry process to form an exposed pattern 36 of the silicone wafer 31 (in this case, the silicon wafer 31 also functions as the undercoating layer) (FIG. 4B). The stepped shape (stepped profile) of the X-ray absorptive member at this time can be controlled by control of:

1. temperature and time of post-baking;
2. mixing of O$_2$ during etching;
3. whole surface irradiation of O$_2$ plasma before etching, etc., whereby any desired stepped shape can be obtained. Next, the above silicon wafer was set in the LPCVD apparatus, and an X-ray absorptive member 33 was formed according to the silane reduction method of $WF_6$.

The formation conditions were:

| | |
|---|---|
| partial pressure of $WF_6$ | $2 \times 10^{-3}$ Torr |
| partial pressure of $SiH_4$ | $1.5 \times 10^{-3}$ Torr |
| growth temperature | 360° C. |
| partial pressure of $H_2$ | 96.5 mTorr, | and an X-ray absorptive member 33 with a film thickness of 0.85 µm was formed only at the exposed portion 36 of the above silicon wafer 31 (FIG. 4C).

On the surface of said substrate, an X-ray transmissive film 34 was formed to a thickness of 2 µm according to the LPCVD under the conditions of:

| | |
|---|---|
| $SiH_2Cl_2$ | 100 sccm |
| $NH_3$ | 500 sccm |
| pressure | 0.3 Torr |
| deposition speed | 180 Å/min. |
| deposition temperature | 800° C. |

The X-ray transmissive film 34 formed had an internal stress of 5 to $7 \times 10^8$ dyn/cm$^2$, which was a value sufficiently small in practical use.

With the outer peripheral portion of the above film as the glueing margin, a pyrex glass 35 (thickness 5 mm, diameter 100 mm, central opening 60 mm) was fixed by adhesion with an acrylic two-liquid mixing type adhesive 37 (G5510, Duca) (FIG. 4E).

After full curing of the adhesive, the silicon wafer was removed by back etching so that the supporting frame made of the pyrex glass was not corroded, to have the X-ray transmissive film and the X-ray absorptive member exposed (FIG. 4F). The X-ray mask structure formed as described above is called X-ray mask structure (L).

EXAMPLES 15–17

X-ray mask structures (M)–(O) were prepared in the same manner as in Example 14, except for forming the X-ray absorptive members according to the CVD method under the conditions as shown below.

EXAMPLE 18

An X-ray mask structure (P) was prepared in the same manner as in Example 14 except for forming the X-ray absorptive member according to the low pressure CVD method under the conditions shown below:

| | |
|---|---|
| $H_2$ pressure | 1.5 Torr |
| $Mo(CO)_6$ partial pressure | $2 \times 10^{-4}$ Torr |
| growth temperature | 450° C. |

| X-ray mask structure | Apparatus | Material gases | Carrier gas | Growth temperature |
|---|---|---|---|---|
| (M) condition 1 | LP CVD | $(n-C_3H_7)_2$ AuCl | $H_2$ | 110° C. |
| (N) condition 2 | LP CVD | $(n-C_3H_7)_2$ AuBr | $H_2$ | 100° C. |
| (O) condition 3 | LP CVD | $(n-C_4H_9)_2$ AuBr | $H_2$ | 70° C. |

Comparative Example 3

After an X-ray transmissive film layer was laminated on a silicon wafer with fairly good smoothness, an electricconductive layer as the plating electrode was deposited, and $SiO_2$ which becomes the side wall material deposited so as to be an amorphous film. At the position where an X-ray absorptive member is to be buried, the $SiO_2$ was etched so that the cross-sectional shape may be reversely tapered to provide an opening. When the X-ray absorptive member was deposited in a gold plating bath through the above plating electrodes, bubbles were found to be attached on the reversely tapered inner wall, and the X-ray absorptive member finished had the portion with the X-ray absorptive member material being defective which is generally called "white flaw". On the other hand, no such defect was seen in the selective gas phase growth method according to the present invention.

EXAMPLE 19

When the masks prepared in Examples 14 to 18 were placed in an X-ray exposure apparatus and subjected to exposure, the surface of the absorptive member on the side facing the resist was found to be very smooth, and therefore the resist could be exposed with a uniform contrast and little irregularity of the X-ray absorption amount.

The exposure conditions were as follows:

| | |
|---|---|
| exposure gap (wafer-mask distance) | 50 µm |
| atmosphere reduced pressure He | 150 Torr |
| X-ray intensity | 150 mW/cm$^2$ |
| exposure time | 1.2 sec. |
| resist thickness RAY-PN, Hoechst | 1 µm. |

If there is any irregularity in the intensity leaked from the absorptive member, the granular resist residue will be formed at the non-exposed portion, but no resist residue was found according to the present Example.

As described in detail above, the X-ray mask structure of the present invention has above all an X-ray absorptive member formed of crystalline grains with larger gain boundary sizes as compared with those of the prior art, and also an X-ray absorptive member having larger density, and hence the absorbability in the X-ray absorptive member is remarkably improved, and yet smoothness at edge portion (side surface) of the X-ray absorptive member is improved. By use of such X-ray mask structure, it is possible to form a printed pattern with high resolution, high precision and high contrast. Further, the preparation process as in the present invention is a process which can prepare an X-ray mask structure having various excellent characteristics as described above.

What is claimed is:

1. A process for preparing an X-ray mask structure comprising the following steps:

providing an X-ray transmissive film, providing an X-ray absorptive member patterned on said X-ray transmissive film providing a supporting frame for supporting said X-ray transmissive film, wherein the steps for patterning of said X-ray absorptive member comprise:

a) forming an exposed pattern of a subbing layer by patterning a side wall material on the surface of said subbing layer, and    b) depositing said X-ray absorptive member selectively only on the exposed portion of said subbing layer according to a gas phase growth method.

2. A process for preparing an X-ray mask structure according to claim 1, wherein said subbing layer contains an electron donative material.

3. A process for preparing an X-ray mask structure according to claim 1, wherein said side wall material contains a non-electron donative material.

4. A process for preparing an X-ray mask structure according to claim 1, wherein said gas phase growth method is a CVD method.

5. A process for preparing an X-ray mask structure according to claim 1, wherein the thickness of said subbing layer has a thickness which is 1% to 14% of the thickness of the deposited film of said X-ray absorptive member.

6. A process for preparing an X-ray mask structure comprising the following steps:

providing an X-ray transmissive film, providing an X-ray absorptive member patterned on said X-ray transmissive film providing a supporting frame for supporting said X-ray transmissive film, wherein the steps for patterning of said X-ray absorptive member comprise:

a) forming an X-ray transmissive film and then forming a subbing layer on the surface of said X-ray transmissive film,    b) depositing an X-ray absorptive member on the surface of said subbing layer according to a gas phase growth method, and    c) patterning the deposited film of said X-ray absorptive member.

7. A process for preparing an X-ray mask structure according to claim 6, wherein said X-ray transmissive film is a silicon carbide film or a silicon nitride film.

8. A process for preparing an X-ray mask structure according to claim 6, wherein said subbing layer comprises an electron donative material.

9. A process for preparing an X-ray mask structure according to claim 6, wherein said gas phase growth method is a CVD method.

10. A process for preparing an X-ray mask structure according to claim 1, wherein said subbing layer has a thickness which is 1% to 14% of the deposited film of said X-ray absorptive member.

* * * * *

UNITED STATES PATENT AND TRADEMARK OFFICE
CERTIFICATE OF CORRECTION

PATENT NO. : 5,607,733

DATED : March 4, 1997

INVENTOR(S) : YASUAKI FUKUDA, ET AL.    Page 1 of 2

It is certified that error appears in the above-identified patent and that said Letters Patent is hereby corrected as shown below:

COLUMN 3

Line 65, "Here,the" should read --Here, the--.

COLUMN 4

Line 39, "$\beta_A$" should read --$\rho_A$--;
Line 52, "$\beta_A=(\mu_A/\mu_B)\beta_B$" should read --$\rho_A=(\mu_A/\mu_B)\rho_B$--; and
Line 54, "$\beta_B$" should read --$\rho_B$--.

COLUMN 5

Line 8, "equal,.and" should read --equal, and--.

COLUMN 7

Line 38, "X-Fay" should read --X-ray--; and
Line 44, "↑" should read --Å--.

COLUMN 9

Line 9, "anistropic" should read --anisotropic--.

COLUMN 11

Line 34, "1.5 Tort)," should read --1.5 Torr),--.

COLUMN 12

Line 48, "AS" should read --As--;
Line 54, "OF" should read --or--; and
Line 58, "In X-ray an" should read --In an X-ray--.

UNITED STATES PATENT AND TRADEMARK OFFICE
CERTIFICATE OF CORRECTION

PATENT NO. : 5,607,733
DATED : March 4, 1997
INVENTOR(S) : YASUAKI FUKUDA, ET AL.

Page 2 of 2

It is certified that error appears in the above-identified patent and that said Letters Patent is hereby corrected as shown below:

COLUMN 14

Line 31, "shrinked" should read --shrunk--.

COLUMN 16

Line 13, "electricco-" should read --electroconductive--; and
    Line 14, "nductive" should be deleted.

COLUMN 18

Line 25, "claim 1," should read --claim 6,--.

Signed and Sealed this

Twenty-third Day of September, 1997

Attest:

BRUCE LEHMAN

Attesting Officer    Commissioner of Patents and Trademarks